(12) United States Patent
Obradovic et al.

(10) Patent No.: US 10,008,580 B2
(45) Date of Patent: Jun. 26, 2018

(54) FET INCLUDING AN INGAAS CHANNEL AND METHOD OF ENHANCING PERFORMANCE OF THE FET

(71) Applicant: Samsung Electronics Co., Ltd., Suwon-si, Gyeonggi-do (KR)

(72) Inventors: Borna J. Obradovic, Leander, TX (US); Titash Rakshit, Austin, TX (US); Mark S. Rodder, Dallas, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days. days.

(21) Appl. No.: 15/346,535

(22) Filed: Nov. 8, 2016

(65) Prior Publication Data

US 2017/0271474 A1    Sep. 21, 2017

Related U.S. Application Data

(60) Provisional application No. 62/311,025, filed on Mar. 21, 2016.

(51) Int. Cl.
| | |
|---|---|
| *H01L 29/66* | (2006.01) |
| *H01L 27/088* | (2006.01) |
| *H01L 29/06* | (2006.01) |
| *H01L 29/20* | (2006.01) |
| *H01L 29/423* | (2006.01) |
| *H01L 29/78* | (2006.01) |

(52) U.S. Cl.
CPC ...... *H01L 29/66522* (2013.01); *H01L 27/088* (2013.01); *H01L 29/0673* (2013.01); *H01L 29/20* (2013.01); *H01L 29/42392* (2013.01); *H01L 29/66795* (2013.01); *H01L 29/66856* (2013.01); *H01L 29/7853* (2013.01)

(58) Field of Classification Search
CPC ......... H01L 29/66856; H01L 29/66795; H01L 29/66522; H01L 29/42392; H01L 29/7853; H01L 29/0673; H01L 27/088; H01L 29/20
See application file for complete search history.

(56) References Cited

U.S. PATENT DOCUMENTS

| | | | |
|---|---|---|---|
| 6,835,969 B1 | 12/2004 | Marsh et al. | |
| 7,291,873 B2 | 11/2007 | Osada et al. | |
| 7,675,090 B2 | 3/2010 | Sadaka et al. | |
| 7,838,905 B2 | 11/2010 | Brar et al. | |
| 2015/0091058 A1 | 4/2015 | Doyle et al. | |
| 2016/0020305 A1 | 1/2016 | Obradovic et al. | |

OTHER PUBLICATIONS

Machine translation of CN 101449366 A.*

* cited by examiner

*Primary Examiner* — Sonya D McCall Shepard
(74) *Attorney, Agent, or Firm* — Lewis Roca Rothgerber Christie LLP

(57) ABSTRACT

According to an embodiment of the present invention, a method of manufacturing a FET device having a set BTBT leakage and a maximum $V_{DD}$ includes: determining an x value in $In_xGa_{1-x}As$ according to the BTBT leakage and the maximum $V_{DD}$, and forming a channel utilizing $In_xGa_{1-x}A$, wherein x is not 0.53.

13 Claims, 10 Drawing Sheets

FET INCLUDING AN INGAAS CHANNEL AND METHOD OF ENHANCING PERFORMANCE OF THE FET

CROSS-REFERENCE TO RELATED PATENT APPLICATION

This application claims priority to and the benefit of U.S. Provisional Patent Application No. 62/311,025, filed in the United States Patent and Trademark Office on Mar. 21, 2016, the entire content of which is incorporated herein by reference.

FIELD

The following description relates generally to field effect transistors (FETs) including channels formed of indium gallium arsenide (InGaAs).

BACKGROUND

Depending on the threshold voltage (Vt), FETs may be categorized as regular threshold voltage (RVT) devices, low threshold voltage (LVT) devices or super low threshold voltage (SLVT) devices. For example, to reach the leakage level of 0.1 nA/μm, 1 nA/μm and 10 nA/μm respectively, the Vt values for a RVT device, an LVT device and an SLVT device may be about 200 mV, 270 mV and 340 mV respectively. FETs may also be classified according to the various architectures, such as finFETs, horizontal nanosheet (hNS) FETs, vertical FETs, vertical nanosheet (vNS) FETs, etc.

The FETs based on channels formed of InGaAs (i.e., InGaAs channels) offer the possibility of high mobility, high injection velocity, and low gate capacitance.

Typically, the In fraction and the Ga fraction in the InGaAs channel add up to 1. Related art InGaAs channels typically utilize an In fraction of 53%. However, $In_{0.53}Ga_{0.47}As$ devices also tend to have small bandgaps (approximately 75 meV, significantly less than 1.1 eV for Si). A consequence of this small bandgap is a large amount of Band-to-Band Tunneling (BTBT) leakage current. Because BTBT leakage is sensitive to the target threshold voltage (Vt) of the device, RVT devices may actually have more leakage than LVT and SLVT devices, compounding the difficulty of meeting their stricter off-current $I_{off}$ targets.

Given the leakage constraints on the RVT devices for mobile SOCs (about 0.1 nA/μm of the effective width of the transistor ($W_{eff}$)), and also because BTBT leakage is exponentially sensitive to the supply voltage $V_{DD}$ and gate length Lg, BTBT imposes a strict upper bound on $V_{DD}$ (generally of about 0.7 V), and a lower bound on Lg (generally of about 12.5 nm). This makes $In_{0.53}Ga_{0.47}As$ unsuitable for standard system on chip (SOC) applications, for example, for the central processing unit (CPU) cores of the SOC, since designs at present technology nodes generally require maximum operating voltages to be in the 0.9-1.4 V range, while even designs at the about 5 nm technology node will generally require maximum operating voltages to be at least in the 0.85-0.9 V range (a normal voltage ($V_{nom}$) of 0.65-0.7 V with a 200 mV overdrive for the maximum oscillation frequency ($f_{max}$)). It is noted that for the range of operating voltages in a SOC, the FETs must achieve a leakage current less than a specific value such that the total chip leakage power is less than or equal to a desired fraction of the overall chip power. Leakage current under overdrive conditions cannot be significantly higher (no more than 2-3×) than under nominal operating conditions.

SUMMARY

An aspect according to one or more embodiments of the present invention is directed toward a method of enhancing the performance of a FET including an InGaAs channel, wherein the In fraction is enhanced (e.g., optimized) to meet the BTBT leakage criterion and the maximum $V_{DD}$.

An aspect according to one or more embodiments of the present invention is directed toward FETs having InGaAs channels, wherein the In fraction is enhanced to meet the BTBT leakage criterion and the maximum $V_{DD}$.

Additional aspects will be set forth in part in the description which follows, and, in part, will be apparent from the description, or may be learned by practice of the presented embodiments.

According to an embodiment of the present invention, a method of manufacturing a FET device having a set BTBT leakage and a maximum $V_{DD}$ includes: determining an x value in $In_xGa_{1-x}As$ according to the BTBT leakage and the maximum $V_{DD}$, and forming a channel utilizing $In_xGa_{1-x}A$, wherein x is not 0.53.

The maximum $V_{DD}$ may be 0.85 V and x may be 40% or less.

The device may be an SLVT device, and x may be 60% or greater.

The device may be a RVT device, and x may be 40% or lower.

According to an embodiment of the present disclosure, a method of manufacturing a FET device having a set BTBT leakage and a maximum $V_{DD}$ for an RVT device includes determining the value of x in $In_xGa_{1-x}As$ according to the BTBT leakage and the maximum $V_{DD}$; forming a first channel utilizing $In_xGa_{1-x}A$; determining BTBT leakage for an LVT and/or SLVT device; determining the value of y in $In_yGa_{1-y}As$ according to the BTBT leakage for the LVT and/or SLVT device; and forming a second channel utilizing $In_yGa_{1-y}As$, wherein y is greater than x.

In one embodiment, y≥x+0.1.

According to another embodiment of the present disclosure, a method of manufacturing a FET device including a RVT device, an LVT device and an SLVT device includes: determining an x value in $In_xGa_{1-x}As$ for the RVT device; determining a y value in $In_yGa_{1-y}As$ for the LVT device; and determining a z value in $In_zGa_{1-z}As$ for an SLVT device, and forming a channel comprising $In_xGa_{1-x}As$ for the RVT device, a channel comprising $In_yGa_{1-y}As$ for the LVT device and a channel comprising $In_zGa_{1-z}As$ for the SLVT device.

In one embodiment, x<y≤z.

The method may further include forming a gate electrode utilizing a same work function material for each of the SLVT, LVT and RVT devices.

According to an embodiment of the present disclosure, a FET device includes a gate electrode, an $In_xGa_{1-x}As$ channel, wherein x is not 0.53, BTBT leakage is 0.1 nA/μm or lower, and the FET device is configured to operate with a maximum $V_{DD}$ of 0.75 V or greater.

In one embodiment, x is about 0.3-0.4, and the FET device is configured to operate with a maximum $V_{DD}$ of 0.8 V or greater.

In one embodiment, x is about 0.2-0.3, and the FET device is configured to operate with a maximum $V_{DD}$ of 0.8 V or greater.

The FET device may further include a buffer layer between the gate electrode and the channel, and the buffer layer may include InGaP and/or InAlAs.

The FET device may further include a second FET comprising a second channel comprising $In_yGa_{1-y}As$, wherein y is greater than x, and the second FET has a BTBT leakage of 1 nA/μm or lower.

The FET device may further include a third FET comprising a third channel comprising $In_zGa_{1-z}As$, wherein z is greater than or equal to y, and the third FET has a BTBT leakage of 10 nA/μm or lower.

In one embodiment, x<y<z.

In one embodiment, $0.2 \leq x < y \leq z \leq 0.8$.

According to an embodiment, a FET device includes an SLVT device, an LVT device and a RVT device, each of the SLVT, LVT and RVT devices includes a gate electrode and an InGaAs channel, wherein the gate electrode for each of the SLVT, LVT and RVT devices includes substantially the same work function material and same thickness, the InGaAs channel for the RVT device is represented by $In_xGa_{1-x}As$, the InGaAs channel for the LVT device is represented by $In_yGa_{1-y}As$, and the InGaAs channel for the SLVT device is represented by $In_zGa_{1-z}As$, wherein x is not the same as y or z.

In one embodiment, z=y+0.1=x+0.2.

The FET device may further include a buffer layer between the gate electrode and the channel, wherein the buffer layer for the SLVT and LVT devices includes InP, and the buffer layer for the RVT device includes InGaP and/or InAlAs.

The FET device may be a horizontal nanosheet FET, and a vertical spacing between neighboring nanosheets is about 15 nm or less.

The width of the horizontal nanosheets may be about 40 nm or less and the thickness of the horizontal nanosheets may be about 10 nm or less.

The FET device may be a fin FET, hNS FET, vertical FET, or vNS FET.

BRIEF DESCRIPTION OF THE DRAWINGS

These and other features and advantages of the present invention will be better understood by reference to the following detailed description when considered in conjunction with the accompanying drawings. It is understood that selected structures and features have not been shown in certain drawings so as to provide better viewing of the remaining structures and features.

DETAILED DESCRIPTION

Figure 1:
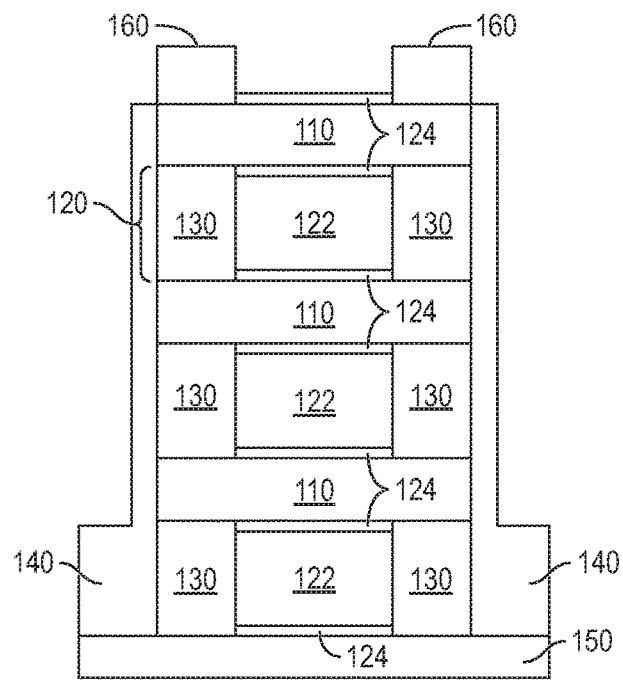
FIG. 1 is a schematic illustration of a cross sectional view of a hNS FET.

Spatially relative terms, such as "below," "beneath," "lower," "above," "upper," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. Embodiments described herein will be described referring to plan views and/or cross-sectional views by way of ideal schematic views of the invention. Accordingly, the example views may be modified depending on manufacturing technologies and/or tolerances. Therefore, the embodiments of the invention are not limited to those shown in the views, but include modifications in configuration formed on the basis of manufacturing processes. Therefore, regions shown in the drawings have schematic properties, and shapes of regions shown in the drawings are examples of specific shapes of regions of elements and do not limit aspects of the invention.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Expressions such as "at least one of" or "at least one selected from" when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration. It will be understood that when an element or layer is referred to as being "on", "connected to", "coupled to", or "adjacent to" another element or layer, it can be directly on, connected to, coupled to, or adjacent to the other element or layer, or one or more intervening elements or layers may be present. In contrast, when an element or layer is referred to as being "directly on," "directly connected to", "directly coupled to", or "immediately adjacent to" another element or layer, there are no intervening elements or layers present.

As used herein, the terms "substantially," "about," and similar terms are used as terms of approximation and not as terms of degree, and are intended to account for the inherent deviations in measured or calculated values that would be recognized by those of ordinary skill in the art. Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

According to its architecture, FETs may be categorized as fin FET, hNS FET, vertical FET, vNS FET, etc. By way of example, FIG. 1 is a schematic illustration of a cross sectional view of a horizontal nanosheet (hNS) FET, and FIG. 2 is a schematic illustration of a vNS FET.

Referring to FIG. 1, the FET includes a plurality of channels 110 stacking vertically over one another, a plurality of gate stacks 120 surrounding each of the channels 110. Each gate stack 120 includes a gate electrode 122 surrounding the channel 110 in a gate-all-around structure, a high-K dielectric 124 in between the gate electrode 122 and the channel 110, and an internal spacer 130 between the gate electrode 122 and the source and drain electrodes 140. The FET also includes a substrate 150 and a pair of contact pads 160.

Figure 2:
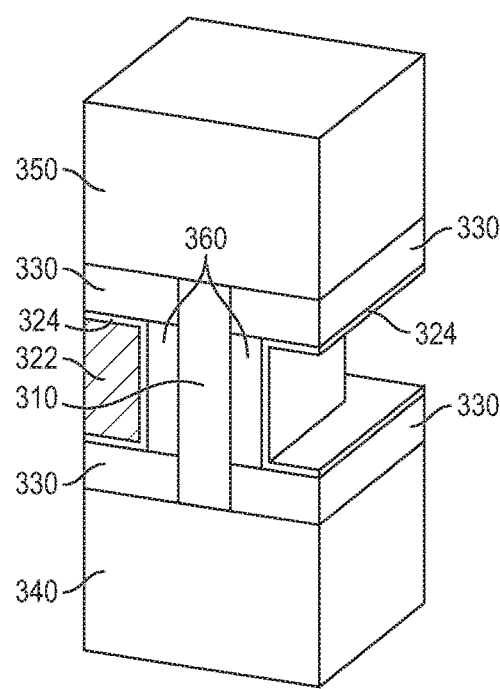
FIG. 2 is a schematic illustration of a vNS FET.

Referring to FIG. 2, the FET includes a bulk source electrode 340, a bulk drain electrode 350, and a channel 310 therebetween. The FET further includes a buffer layer 360 surrounding the channel region, a spacer 330 between the bulk source and drain electrodes and the gate electrode 322, and a high-K dielectric 324 in between the gate electrode 322 and the channel 310.

Here, the channel 110 and 310 may be formed of InGaAs. The high-K dielectric 124 and 324 may be formed of a suitable material, such as $Al_2O_3$ and/or $Hf_2O_3$. The spacers 130 and 330 may be formed of a lower K dielectric such as a metal oxide or a nitride. In one embodiment, the spacers 130 and 330 may be formed of $SiO_2$. The buffer layer 360 may be formed of indium phosphite (InP). The source and drain electrodes 140, 340 and 350 may be formed of any suitable materials. In one embodiment, the source and drain electrodes are formed of substantially the same material as the channel, such as InGaAs, but with higher In fraction than the channel. Or, source and drain electrodes may be highly doped with a suitable dopant to provide low contact resistance. The gate electrode 122 and 322 may be formed of a suitable metal material, such as TiN. The substrate may be formed of $SiO_2$ for an OI version of the process, or wide bandgap semiconductors such as InAlAs.

While three horizontal gates are illustrated in FIG. 1 and one vertical gate is illustrated in FIG. 2, embodiments of the present invention are not limited thereto.

According to an embodiment of the present disclosure, a method of manufacturing a FET device having a set BTBT leakage and a maximum $V_{DD}$ includes determining the value of x in $In_xGa_{1-x}As$ according to the BTBT leakage and the maximum $V_{DD}$, and forming a channel utilizing $In_xGa_{1-x}A$.

The BTBT of a FET device including an InGaAs channel is influenced by a number of factors, for example, $V_{DD}$, the In content in InGaAs, etc. When the $V_{DD}$ and BTBT of a device are determined, the value of x in $In_xGa_{1-x}As$ can be enhanced to deliver a device with the desired BTBT at the maximum $V_{DD}$. Here, the optimization includes determining a range for the In content that satisfies the BTBT requirement at the maximum $V_{DD}$, and choosing an In content from the range that also provides satisfactory injection velocity.

The BTBT values for a RVT device may be about 0.1 nA/μm, for an LVT device may be about 1 nA/μm, and for an SLVT device may be about 10 nA/μm. That is, the BTBT criterion is the lowest for a RVT device and highest for an SLVT device.

In a related art FET utilizing $In_{0.53}Ga_{0.47}As$, because the BTBT for a RVT device is at about 0.1 nA/μm for Weff, and because BTBT is exponentially sensitive to $V_{DD}$, the $V_{DD}$ for such a related art device is limited to be about 0.7 V or lower. However, to be utilized for standard SOC applications, the designs at present technology nodes generally require maximum operating voltages to be in the 0.9-1.4 V range. Even designs at the cutting edge 5 nm technology node will generally require maximum operating voltages to be at least in the 0.85-0.9 V range (a $V_{nom}$ of 0.65-0.7V with a 200 mV overdrive for $f_{max}$). As such, FETs with $In_{0.53}Ga_{0.47}As$ channels are not suitable for standard SOC applications.

Figure 3:
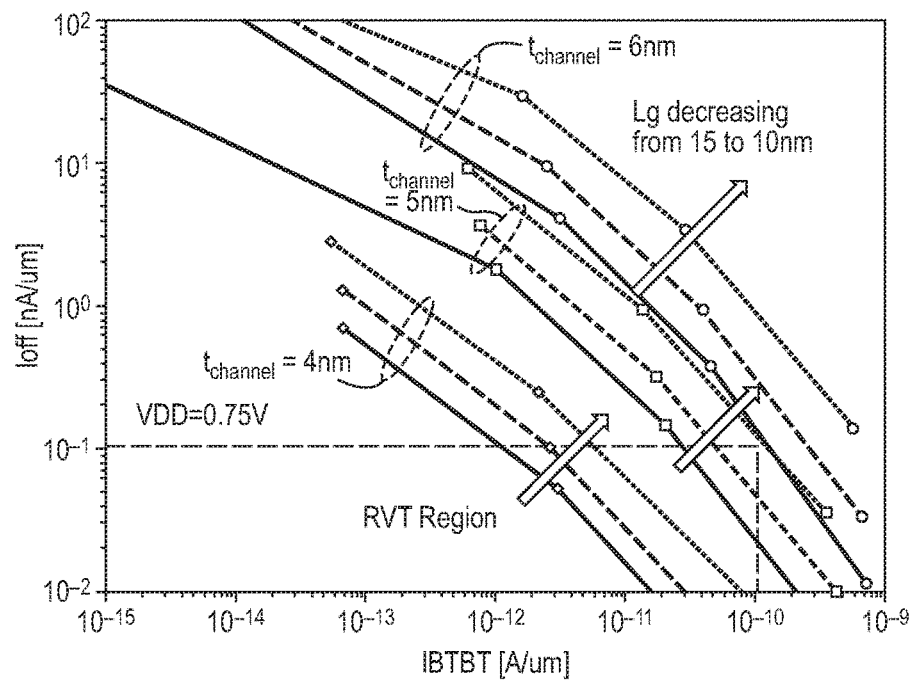
FIG. 3 is a graph illustrating the effect of channel thickness and gate length on BTBT leakage.

BTBT leakage is also affected by the gate length and the channel thickness. FIG. 3 is a graph illustrating the effect of channel thickness and gate length on BTBT leakage. In FIG. 3, $I_{off}$ indicates the thermionic current and IBTBT is the BTBT leakage. For a RVT device, both $I_{off}$ and IBTBT should be limited to be under 0.1 nA, as indicated in the shaded area in FIG. 3. As shown in FIG. 3, BTBT leakage has a strong dependence on the gate length (Lg).

In fact, at $V_{DD}$ of 0.75 V, the minimum gate length for a FET with a $In_{0.53}Ga_{0.47}As$ channel is about 12.5 nm. On the other hand, due to the effect of channel thickness on BTBT, at $V_{DD}$ of 0.75 V, the maximum channel thickness is less than 5 nm. Such limitations on the minimum gate length and maximum channel thickness present great challenges to the manufacturing process. Also, it is impossible for such devices to support +200 mV $V_{DD}$ overdrive. Therefore, the related art FET utilizing $In_{0.53}Ga_{0.47}As$ is not suitable for the standard SOC applications, such as mobile SOC applications, and not a suitable replacement for a silicon (Si) device, which has been utilized for such applications.

When a FET is manufactured according to embodiments of the present invention, because the In content in the InGaAs channel is enhanced based on the requirements on BTBT and the maximum $V_{DD}$, it can satisfy both the low BTBT and high $V_{DD}$ requirement and therefore, be suitable for the standard SOC applications.

The In content impacts a number of performance factors in a FET. For example, including a larger Indium (In) fraction will lead to a smaller bandgap and higher mobility/injection velocity. On the other hand, including a smaller In fraction may lead to an increased bandgap and correspondingly (exponentially) smaller BTBT leakage current. That is, there is a tradeoff between mobility and BTBT leakage as a function of the In fraction.

Figure 4:
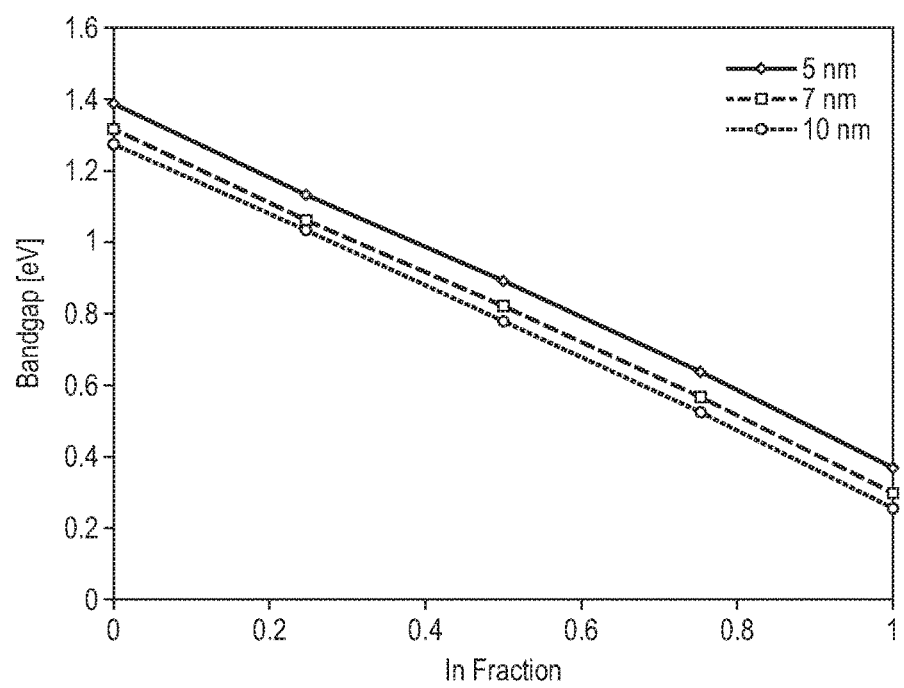
FIG. 4 is a graph showing the effect of In fraction on the bandgap.
Figure 5:
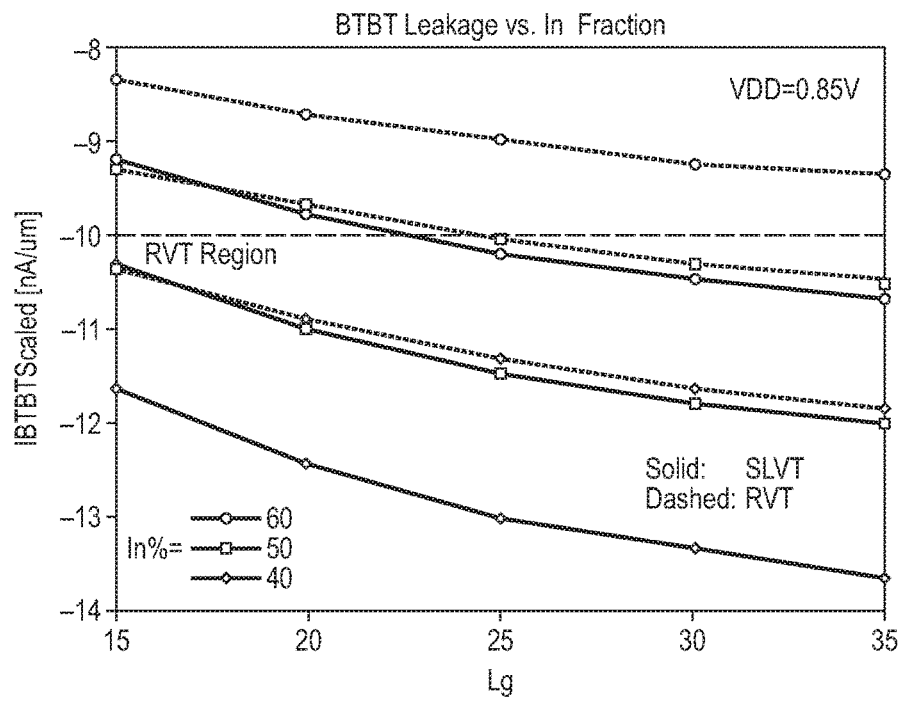
FIG. 5 is a graph showing the effect of In content on BTBT at various gate lengths.

The bandgap sets the tunneling barrier, and the bandgap is highly sensitive to the In fraction. That is, reducing the In fraction will increase the tunneling barrier and reduce the BTBT leakage accordingly. FIG. 4 is a graph showing the effect of In fraction on the bandgap at various gate lengths. As shown in FIG. 4, when In content is 0.53 as in the related art InGaAs devices, the bandgap is about 0.8 eV. However, when In content is about 0.3, the bandgap is close to that of Si at about 1.1 eV. FIG. 5 is a graph showing the effect of In content on BTBT at various gate lengths. As shown in FIG. 5, at 40% In, $V_{DD}$ up to 0.85 V can be supported in a RVT device.

Figure 6:
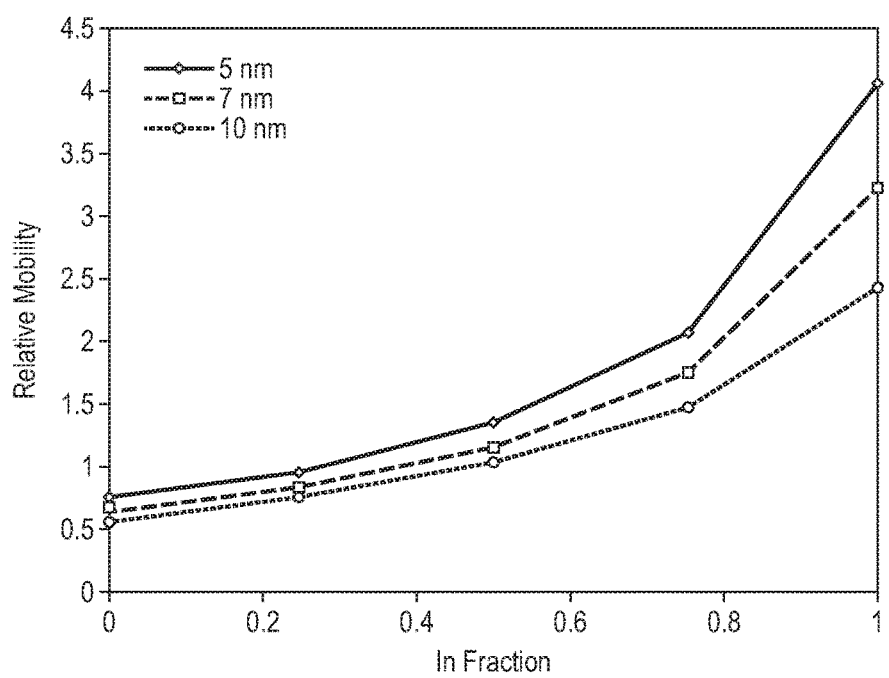
FIG. 6 is a graph showing the effect of In content on relative mobility.
Figure 7:
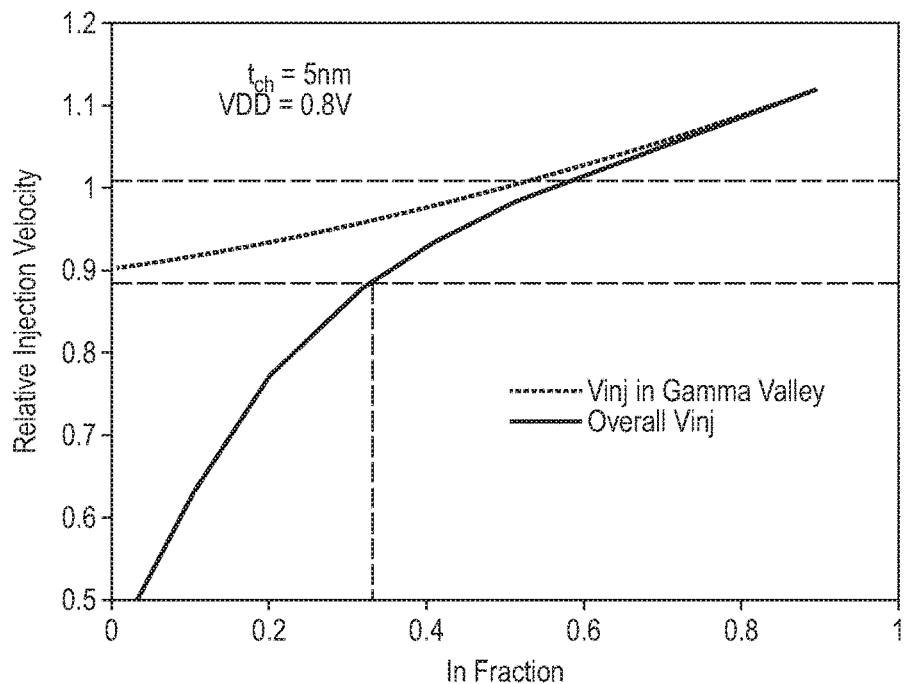
FIG. 7 is a graph showing the effect of In content on relative injection velocity.

Reducing the content of In may also lead to lower mobility and injection velocity. FIG. 6 is a graph showing the effect of In content on relative mobility at various gate lengths. As shown in FIG. 6, the relative mobility increases when the In content increases. FIG. 7 is a graph showing the effect of In content on relative injection velocity at channel thickness of 5 nm and $V_{DD}$ of 0.8 V. As shown in FIG. 7, the relative injection velocity increases when the In content increases. However, when reducing the In content from 53% to 35%, as shown in FIG. 7, the relative injection velocity reduces by less than 10%, which is still about 3 times that of Si.

Here, as shown in FIG. 7, when the In content is lower than 30%, there is a relatively greater loss in relative injection velocity when the In content is further reduced. This phenomenon is mostly due to the electron spillover from the Gamma valley to the L valley. According to an embodiment of the present disclosure, a tensile strain-inducing buffer layer may be utilized to suppress the electron spillover from the Gamma valley to the L valley. For example, the tensile strain-inducing buffer layer may include InGAP and/or InAlAs and may be located on the channel. Accordingly, the In content may be about 20% to about 30% and still have an acceptable relative injection velocity.

Figure 8:
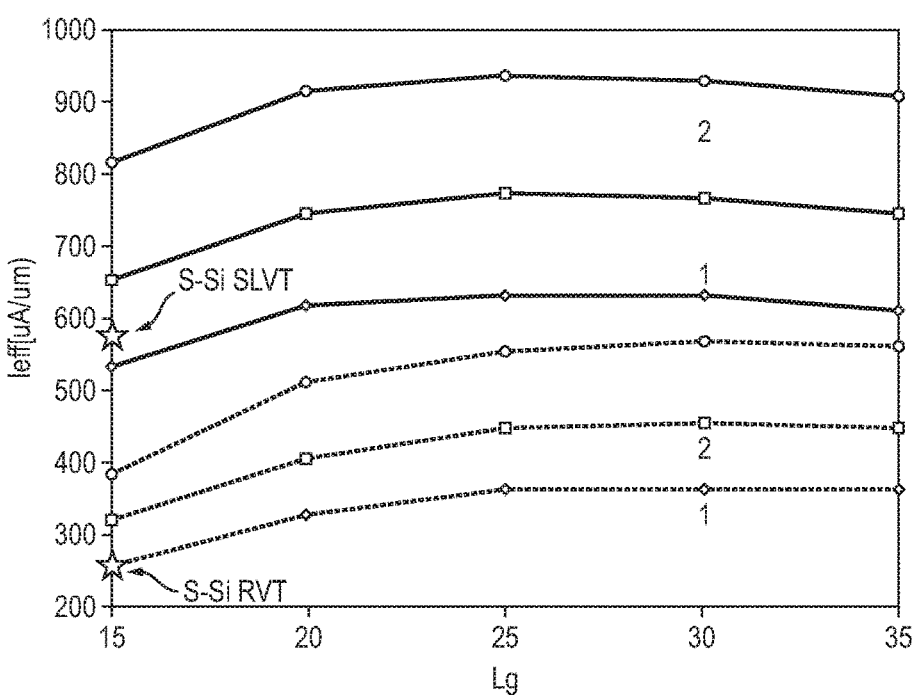
FIG. 8 is a graph illustrating the effect of In content in InGaAs channel on I eff at various gate lengths.

FIG. 8 is a graph illustrating the effect of In content in InGaAs channel on the effective drive current $I_{eff}$ at various gate lengths. Referring to FIG. 8, it is noted that InGaAs channels, even at an In content of 40%, still have an $I_{eff}$ comparable to that of strained Si for each of the RVT and SLVT devices. Also, the higher the In content, the greater the $I_{eff}$ for both RVT and SLVT devices.

Figure 9:
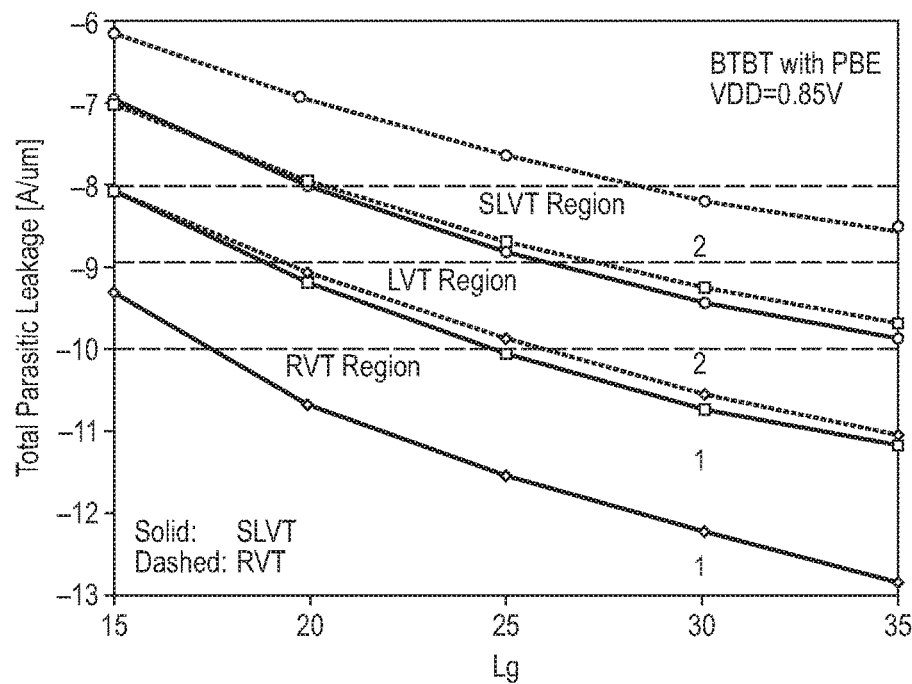
FIG. 9 is a graph illustrating the effect of In content in InGaAs channel on total parasitic leakage at various gate lengths.

FIG. 9 is a graph illustrating the effect of In content in InGaAs channel on total parasitic leakage (BTBT with Parasitic bipolar effect) at various gate lengths and a $V_{DD}$ of 0.85 V. Referring to FIG. 9, it is noted that in order to be utilized in the RVT region, In content of 40% or lower at a gate length of 25 nm or greater is needed. For example, an In content of 40% and a gate length of 30 nm may be utilized to make a RVT device. Here, for a RVT device, the In content is chosen for the best power, performance and area at low $V_{DD}$, while supporting $V_{DD}$ overdrive.

As shown in FIG. 9, a device with In content of 50% does not appear to provide satisfactory total parasitic leakage within the gate length of 15 nm to 35 nm, and the leakage gets higher with greater In content. It is clear that the related art InGaAs channel with an In content of 53% would not be able to have the desired leakage performance.

On the other hand, if utilized in the SLVT region, In content of 60% at a gate length of about 20 is satisfactory. Therefore, for an SLVT device, an In content of 60% or greater may be utilized. That is, a greater In content may be utilized in an SLVT device relative to a RVT device, as an SLVT device is less prone to BTBT leakage. From FIG. 8, it can be seen that such an SLVT has an $I_{eff}$ significantly above that of a strained Si device.

Further, from FIG. 9, it can be observed that an InGaAs channel with about 40% In and about 30 nm gate length may be utilized for all Vt flavors, i.e., RVT, LVT and SLVT. That is, a single In faction may be utilized to have the best tradeoff in mobility, leakage and maximum $V_{DD}$.

In more detail, when BTBT is lower as in a RVT (e.g., 0.1 nA/μm), the amount of In may be lower than 0.5, for example, 0.4 or less in order to support a $V_{DD}$ of 0.85 V or greater. When BTBT is higher as in an SLVT (e.g., 10 nA/μm), the amount of In may be higher than 0.53, for example, 0.6 or greater.

Figure 10:
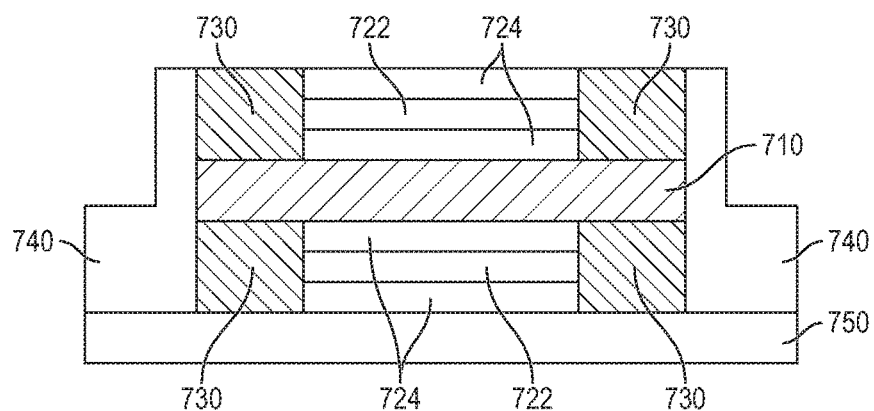
FIG. 10 is a schematic illustration of a FET manufactured according to an embodiment of the present disclosure.

FIG. 10 is a schematic illustration of a FET manufactured according to an embodiment of the present disclosure. Referring to FIG. 10, a FET device includes a gate electrode 722, an $In_xGa_{1-x}As$ channel 710, wherein x is not 0.53, BTBT leakage is 0.1 nA/μm or lower, and the FET device is configured to operate with a maximum $V_{DD}$ of 0.75 V or greater. The FET further includes source and drain electrodes 740, high-K dielectric 724, and spacer 730.

In one embodiment, x may be about 0.3-0.4, and the FET device is configured to operate with a maximum $V_{DD}$ of 0.8 V or greater.

In one embodiment, x may be about 0.2-0.3, and the FET device is configured to operate with a maximum $V_{DD}$ is 0.8 V or greater.

Figure 11:
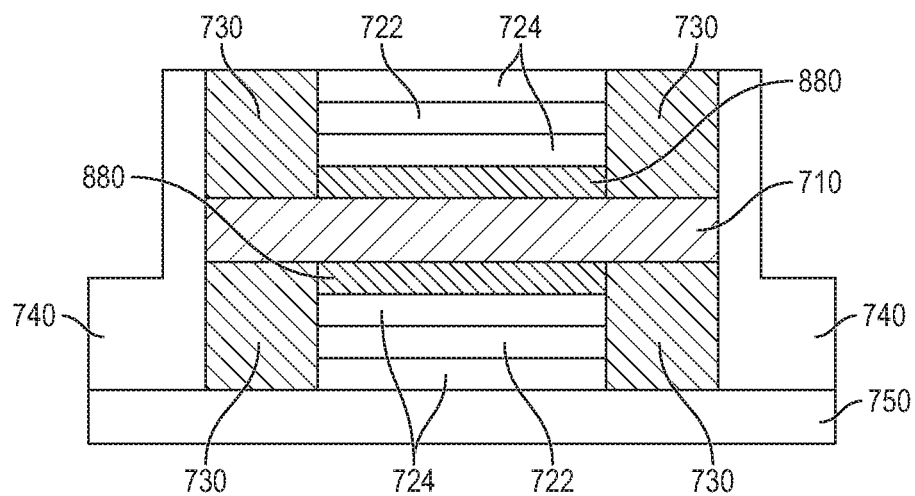
FIG. 11 is a schematic illustration of a FET manufactured according to an embodiment of the present disclosure.

FIG. 11 is a schematic illustration of a FET manufactured according to an embodiment of the present disclosure. Referring to FIG. 11, The FET device may further include a buffer layer 880 between the gate electrode and the channel, and the buffer layer may include InGaP and/or InAlAs.

The process of manufacturing the FET according to embodiments of the present disclosure may be any suitable process, such as the one disclosed in CA 1196111 A1, US 20060024874 and US 20080296622, the entire contents of all of which are incorporated herein by reference.

According to an embodiment of the present disclosure, a method of manufacturing a FET device having a set BTBT leakage and a maximum $V_{DD}$ for a RVT device includes: determining the value of x in $In_xGa_{1-x}As$ according to the BTBT leakage and the maximum $V_{DD}$, forming a first channel utilizing $In_xGa_{1-x}A$; determining BTBT leakage for an LVT and/or SLVT device; determining the value of y in $In_yGa_{1-y}As$ according to the BTBT leakage for the LVT and/or SLVT device, and forming a second channel utilizing $In_yGa_{1-y}As$, wherein y is greater than x. For example, y may be the sum of x and 0.1, or greater. Here, the combination of a RVT with relatively lower In content to satisfy the BTBT and the maximum $V_{DD}$ requirements, and an LVT and/or SLVT with relatively higher In content provides better DC performance than just a single RVT device.

Figure 12:
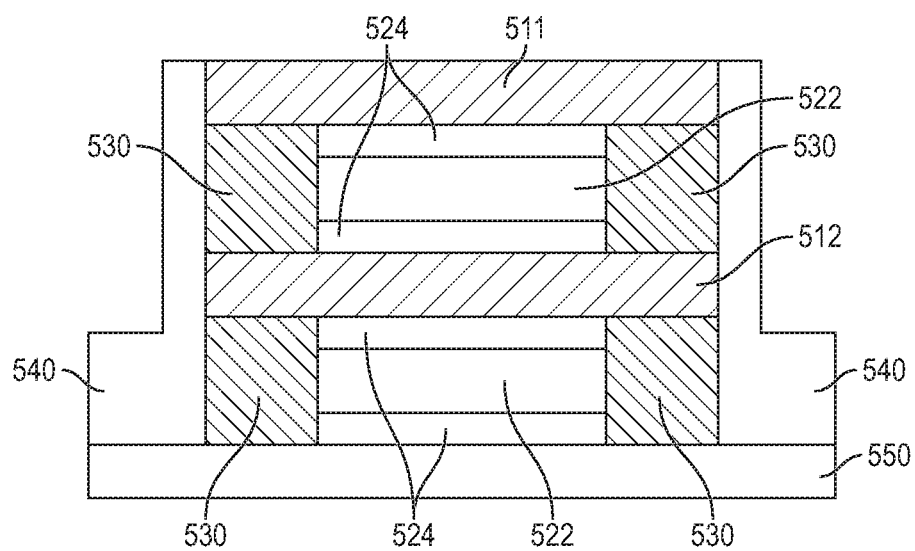
FIG. 12 is a schematic illustration of a FET manufactured according to an embodiment of the present disclosure.

FIG. 12 is a schematic illustration of a FET manufactured according to the present embodiment. Referring to FIG. 12, a FET includes a first channel 511 that is formed of $In_xGa_{1-x}A$, and a second channel 512 that is formed of $In_yGa_{1-y}As$. The FET further includes gate electrodes 522 surrounding the first and second channels 511 and 512, source and drain electrodes 540, high-K dielectric 524, spacer 530 and a substrate 550. Here, the In content in the first channel of $In_xGa_{1-x}As$ is selected to meet the BTBT leakage and the maximum $V_{DD}$ while the In content in the second channel of $In_yGa_{1-y}As$ is greater than that of the first channel to provide better DC performance. For example, x may be 0.4 and y may be 0.6; or x may be 0.3 and y may be 0.6.

Figure 15:
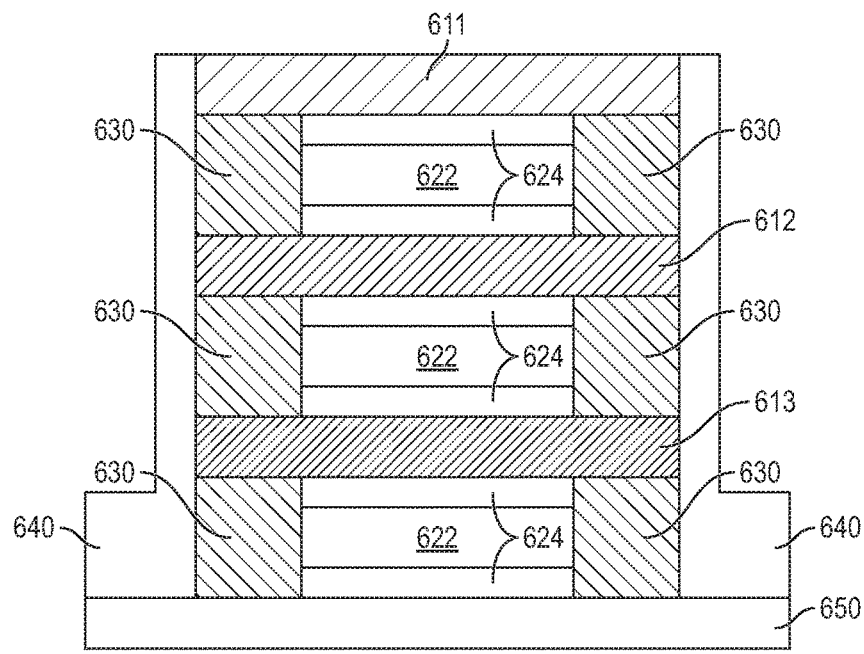
FIG. 15 is a schematic illustration of a FET manufactured according to an embodiment of the present disclosure.

Referring to FIG. 15, the FET device may further include a third FET including a third channel comprising $In_zGa_{1-z}As$, wherein z is greater than or equal to y, and the third FET has a BTBT leakage of 10 nA/μm or lower.

In one embodiment, x<y<z.

In one embodiment, $0.2 \leq x < y \leq z \leq 0.8$.

According to another embodiment of the present disclosure, a method of manufacturing a FET device that includes a RVT device, an LVT device and an SLVT device includes: determining an x value in $In_xGa_{1-x}As$ for the RVT device; determining a y value in $In_yGa_{1-y}As$ for the LVT device; and determining a z value in $In_zGa_{1-z}As$ for the SLVT device, and forming a channel comprising $In_xGa_{1-x}As$ for the RVT device, a channel comprising $In_yGa_{1-y}As$ for the LVT device and a channel comprising $In_zGa_{1-z}As$ for the SLVT device. In one embodiment, $x<y\leq z$. Here, the combination of a RVT with relatively lower In content to satisfy the BTBT and the maximum $V_{DD}$ requirements, and an LVT and an SLVT with relatively higher In content provides better DC performance than just a single RVT device.

The method may further include forming a gate electrode utilizing a same work function material for each of the SLVT, LVT and RVT devices. That is, a single work function material and thickness may be used for forming the gate electrode for each of the SLVT, LVT and RVT devices.

The related art methods of making a device with multiple different Vt values (i.e., Vt modulation) include selecting a metal material for forming the gate electrode, and then varying the thickness of the gate electrode to achieve a desired work function (WF) and therefore, the desired Vt values. However, for some of the Vt values, the gate thickness may need to be relatively high, for example, some of the gate electrodes may have a thickness of about 50 nm. Spacing between adjacent channels is accordingly increased due to the increased thickness of the gate electrode.

Figure 13:
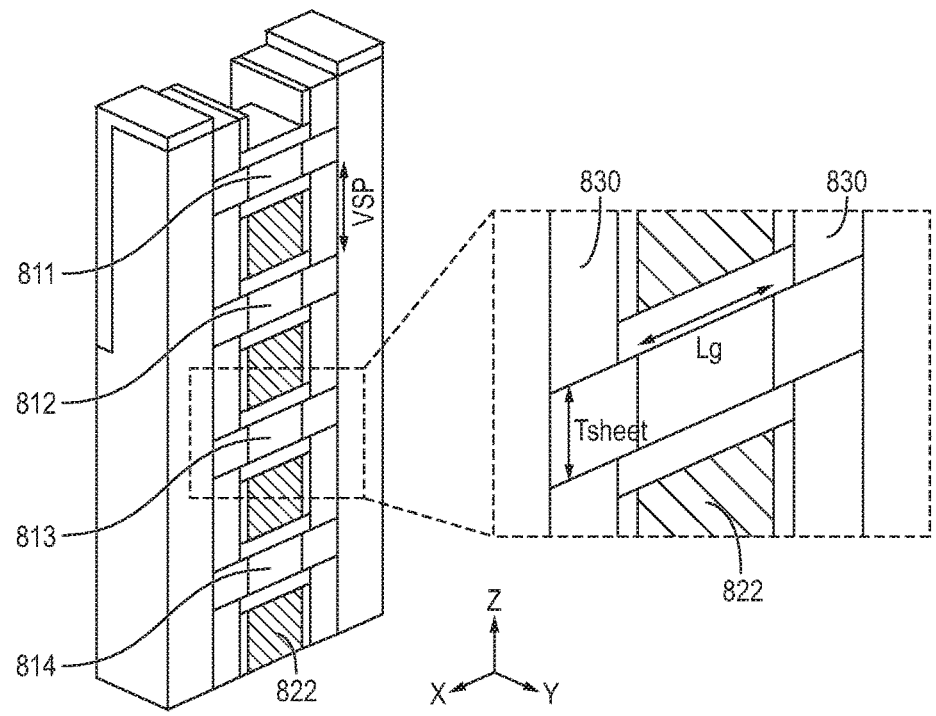
FIG. 13 is a schematic illustration of a hNS multi-Vt device.

However, a device manufactured according to embodiments of the present disclosure may keep a same desired thickness for the gate electrode throughout all the Vt values. FIG. 13 is a schematic illustration of a hNS multi-Vt device. Referring to FIG. 13, the multi-Vt device includes four channels 811, 812, 813 and 814. As shown in the insert in more detail, each channel has a thickness Tsheet and is surrounded by a gate electrode 822. An internal spacer 830 is between the gate electrode 822 and its neighboring source or drain electrodes. The thickness of the gate electrode (VSP) is the same for each of the Vt devices. The length of the gate electrode is represented by Lg. By adjusting the In content, the conductive band (CB) energy of each channel is modulated, and therefore, enables tuning of the Vt according to the In content. That is, each of the channels 811-814 includes InGaAs but with a different In content to provide for four different Vt flavors.

Figure 14:
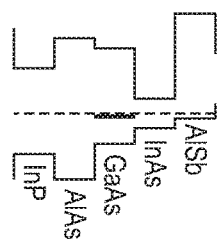
FIG. 14 shows the conductive band of various materials.

FIG. 14 shows the conductive band of various materials. Referring to FIG. 14, by adjusting the content of In in InGaAs, the conductive band may be adjusted to have the suitable work function for the desired threshold voltage Vt.

For example, the In composition for an SLVT device may be first determined according to the BTBT criterion. The In content for an LVT region may be determined to increase the Vt by about 70 mV relative to the SLVT. Then the In content for a RVT region may be determined to increase the Vt by about 70 mV relative to the LVT.

FIG. 15 is a schematic illustrate of a FET manufactured according to the present embodiment. Referring to FIG. 15, a FET includes a first channel 611 that is formed of $In_xGa_{1-x}A$, a second channel 612 that is formed of $In_yGa_{1-y}As$, and a third channel 613 formed of $In_zGa_{1-z}As$. The FET further includes gate electrodes 622 surrounding the first and second channels 611 and 612, source and drain electrodes 640, high-K dielectric 624, spacer 630 and a substrate 650. Here, the In content in the first channel of $In_xGa_{1-x}As$ is selected to meet the BTBT leakage and the maximum $V_{DD}$ while the In content in the second and third channels is greater than that of the first channel to provide better DC performance. For example, x may be 0.4, and y and z may be 0.6; or x may be 0.3 and y and z may be 0.6.

Figure 16:
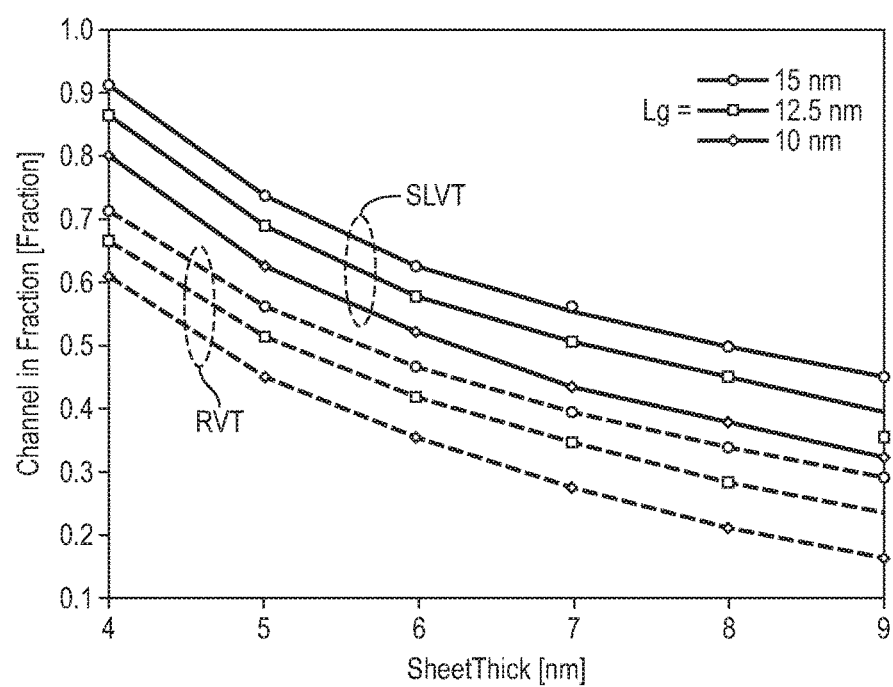
FIG. 16 shows the composition required for a given Vt flavor.

FIG. 16 shows the composition required for a given Vt flavor. Referring to FIG. 16, for a given sheet thickness and a given gate length, an SLVT device may have a higher In content than a RVT device.

In one embodiment, the amount of In for an LVT region may be greater than that in a RVT region, and the amount of In for an SLVT region may be greater than that in an LVT region. For example, the amount of In for an LVT region may be that in a RVT region plus 0.1, and the amount of In for an SLVT region may be that in a RVT region plus 0.2.

Figure 19:
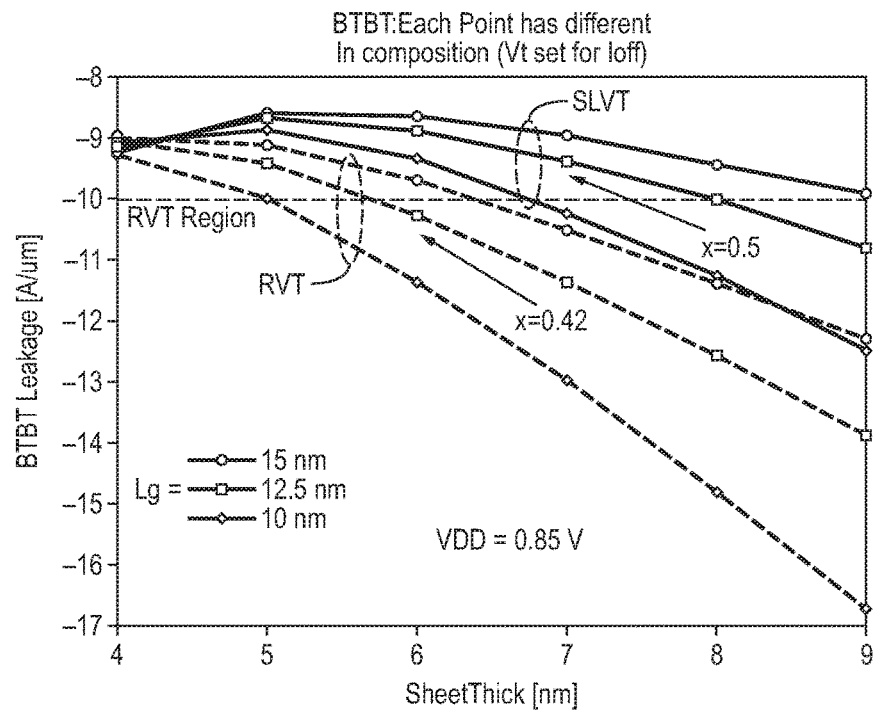
FIG. 19 is a graph illustrating the effect of sheet thickness in InGaAs channel on BTBT leakage.
Figure 20:
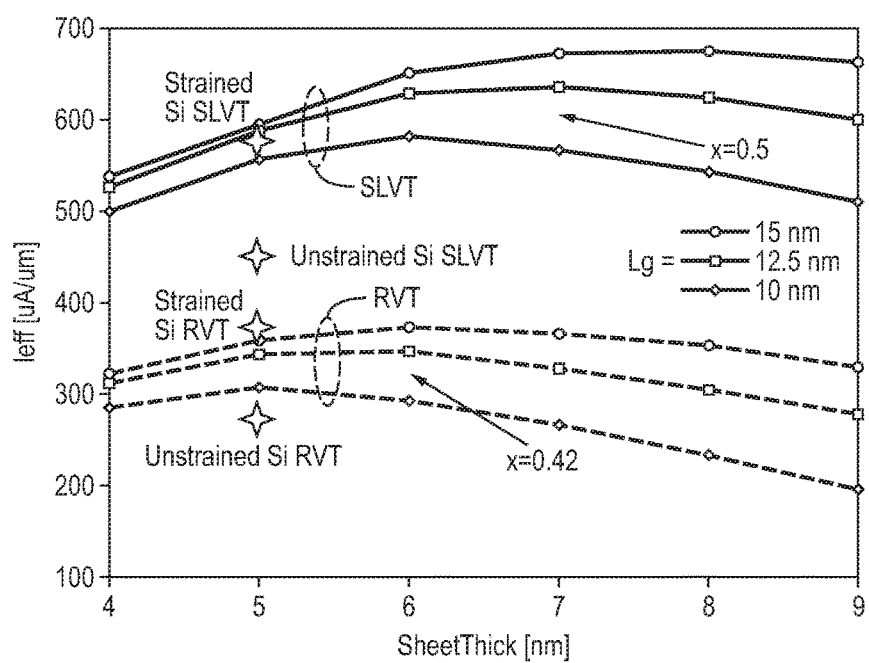
FIG. 20 is a graph illustrating the effect of sheet thickness in InGaAs channel on $I_{eff}$.

FIG. 19 is a graph illustrating the effect of sheet thickness in InGaAs channel on BTBT leakage. FIG. 20 is a graph illustrating the effect of sheet thickness in InGaAs channel on $I_{eff}$. As shown in FIGS. 19 and 20, different In content may be used for the RVT device (e.g., 0.42) and for the SLVT device (e.g., 0.5). For each device, the channel thickness may be enhanced (e.g., optimized) separately for each Vt flavor. Therefore, thinner sheet or fin spacing may be realized.

Figure 17:
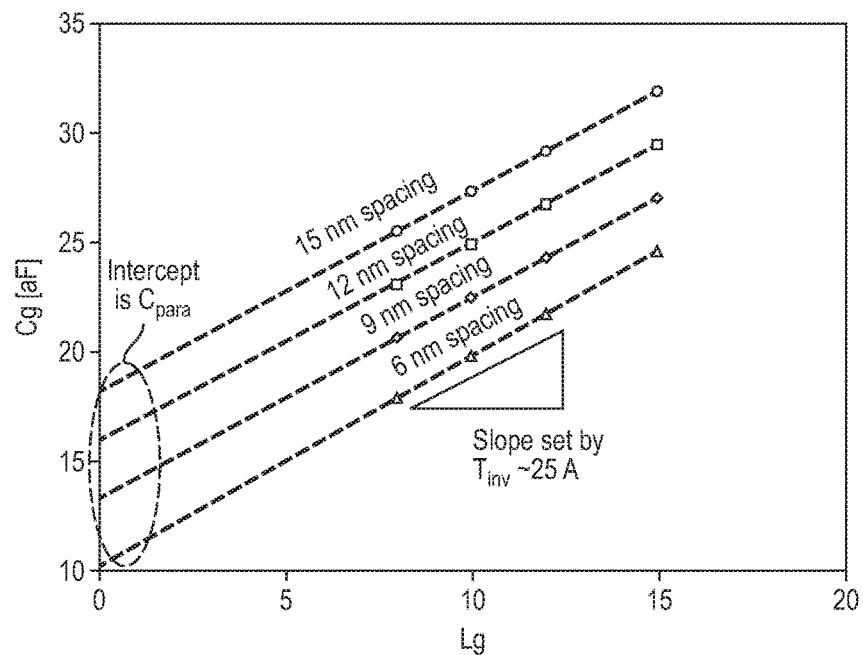
FIG. 17 is a graph illustrating the effect of nanosheet spacing in InGaAs channel on gate capacitance at various gate lengths.
Figure 18:
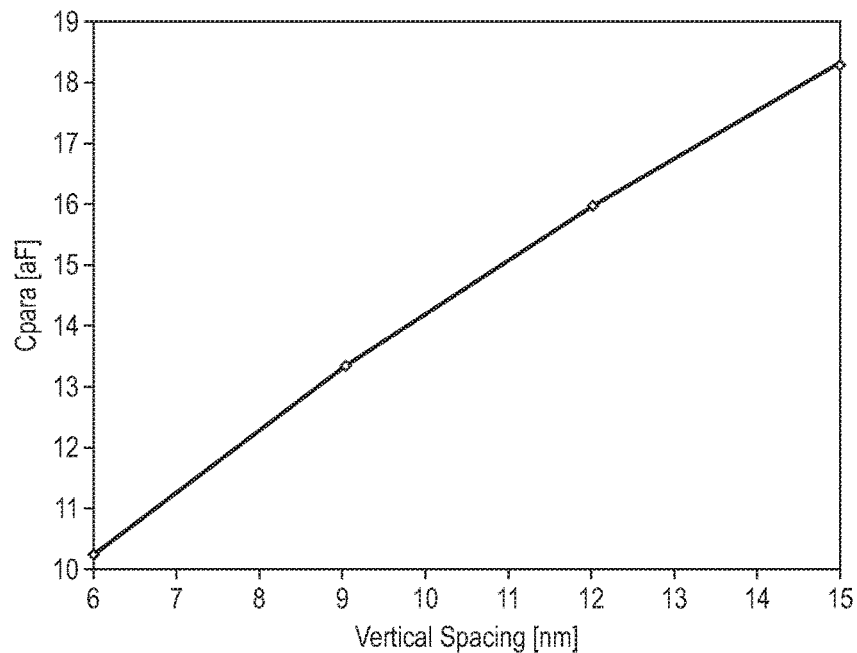
FIG. 18 is a graph illustrating the effect of nanosheet spacing in InGaAs channel on gate parasitic capacitance.

A thinner metal gate enables tighter nanosheet spacing (for example, vertically or horizontally) than the related art multiple work function metals. Further, smaller nanosheet spacing also reduces the parasitic capacitance, as shown in FIG. 17. FIG. 17 is a graph illustrating the effect of nanosheet spacing in InGaAs channel on gate capacitance at various gate lengths. FIG. 18 is a graph illustrating the effect of nanosheet spacing in InGaAs channel on gate parasitic capacitance. As shown in FIGS. 17 and 18, at smaller spacing, the parasitic capacitance (the intercept of the Cg vs Lg curve with the Cg axis) is smaller, and the gate capacitance is also smaller. For example, when the spacing is reduced from 15 nm to 6 nm, a reduction of about 25% in the gate capacitance may be realized. In one embodiment, the spacing may be about 15 nm. In another embodiment, the spacing may be about 6-9 nm. According to an embodiment, the In content varies from about 20% to about 80% across the range of Vts on a single chip.

According to an embodiment, a FET device includes an SLVT device, an LVT device and a RVT device, each of the SLVT, LVT and RVT devices includes a gate electrode and an InGaAs channel, wherein the gate electrode for each of the SLVT, LVT and RVT devices includes substantially the same work function material and same thickness, the InGaAs channel for the RVT device is represented by $In_xGa_{1-x}As$, the InGaAs channel for the LVT device is represented by $In_yGa_{1-y}As$, and the InGaAs channel for the SLVT device is represented by $In_zGa_{1-z}As$, wherein x is not the same as y or z.

In one embodiment, z=y+0.1=x+0.2.

The FET device may further include a buffer layer between the gate electrode and the channel, wherein the buffer layer for the SLVT and LVT devices includes InP, and the buffer layer for the RVT device includes InGaP and/or InAlAs.

The FET device may be a horizontal nanosheet FET, and a vertical spacing between neighboring nanosheets is about 15 nm or less.

The width of the horizontal nanosheets may be about 40 nm or less and the thickness of the horizontal nanosheets may be about 10 nm or less.

The FET device may be a fin FET, hNS FET, vertical FET, or vNS FET.

In one embodiment, the FET is an nFET.

In view of the foregoing, embodiments of the present invention provide a method of enhancing the performance of a FET including an InGaAs channel, wherein the In fraction is enhanced (e.g., optimized) to meet the BTBT leakage criterion and the maximum $V_{DD}$.

In view of the foregoing, embodiments of the present invention provide FETs having InGaAs channels, wherein the In fraction is enhanced to meet the BTBT leakage criterion and the maximum $V_{DD}$.

While one or more embodiments of the present invention have been described with reference to the figures, it will be understood by those of ordinary skill in the art that various changes in form and details may be made therein without departing from the spirit and scope of the present invention as defined by the following claims, and equivalents thereof.

What is claimed is:

1. A method of manufacturing a FET device having a set BTBT leakage and a maximum $V_{DD}$, the method comprising:
   determining an x value in $In_xGa_{1-x}As$ according to the BTBT leakage and the maximum $V_{DD}$; and
   forming a channel utilizing $In_xGa_{1-x}As$, wherein x is not 0.53,
   wherein the x value is determined to be lower than 0.5 for a BTBT of 0.1 nA/μm or lower, and the x value is determined to be greater than 0.53 for a BTBT of 10 nA/μm or greater.

2. The method of claim 1, wherein the maximum $V_{DD}$ is 0.85 V, and x is 0.40 or less.

3. The method of claim 1, wherein the device is an SLVT, and x is at least 0.60.

4. The method of claim 1, wherein the device is a RVT device, and x is 0.40 or less.

5. A method of manufacturing a FET device having a first set BTBT leakage and a first maximum $V_{DD}$, the method comprising:
   determining a value of x in $In_xGa_{1-x}As$ according to the first set BTBT leakage and the first maximum $V_{DD}$;
   forming a first channel utilizing $In_xGa_{1-x}As$;
   determining a second BTBT leakage for an LVT and/or SLVT device;
   determining a value of y in $In_yGa_{1-y}As$ according to the second BTBT leakage for the LVT and/or SLVT device; and
   forming a second channel utilizing $In_yGa_{1-y}As$, wherein y is greater than x.

6. The method of claim 5, wherein y≥x+0.1.

7. A FET device, comprising a first FET comprising a gate electrode, an $In_xGa_{1-x}As$ channel, and a buffer layer between the gate electrode and the channel,
   wherein x is not 0.53,
   BTBT leakage is 0.1 nA/μm or lower, and
   the FET device is configured to operate with a maximum $V_{DD}$ of at least 0.7 V,
   wherein the FET device further comprises a second FET comprising a second channel comprising $In_yGa_{1-y}As$, wherein y is greater than x, and the second FET has a BTBT leakage of 1 nA/μm or lower.

8. The FET device of claim 7, wherein x is about 0.3-0.4, and the FET device is configured to operate with the maximum $V_{DD}$ of at least 0.8 V.

9. The FET device of claim 7, wherein x is about 0.2-0.3, and the FET device is configured to operate with the maximum $V_{DD}$ of at least 0.8 V.

10. The FET device of claim 7, wherein the first FET further comprises a buffer layer between the gate electrode and the $In_xGa_{1-x}As$ channel, the buffer layer comprising a compound selected from the group consisting of InGaP, InAlAs, and a combination thereof.

11. The FET device of claim 7, further comprising a third FET comprising a third channel comprising $In_zGa_{1-z}As$, wherein z is greater than or equal to y, and the third FET has a BTBT leakage of 10 nA/μm or lower.

12. The FET device of claim 11, wherein x<y<z.

13. The FET device of claim 11, wherein 0.2≤x<y<z≤0.8.

* * * * *